(12) United States Patent
Brooks et al.

(10) Patent No.: US 12,219,716 B2
(45) Date of Patent: Feb. 4, 2025

(54) COATED ELECTRICAL ASSEMBLY

(71) Applicant: HZO, Inc., Morrisville, NC (US)

(72) Inventors: Andrew Simon Hall Brooks, Cambridgeshire (GB); Timothy Allan Von Werne, London (GB)

( * ) Notice: Subject to any disclaimer, the term of this patent is extended or adjusted under 35 U.S.C. 154(b) by 284 days.

(21) Appl. No.: 17/505,802

(22) Filed: Oct. 20, 2021

(65) Prior Publication Data

US 2022/0046803 A1  Feb. 10, 2022

Related U.S. Application Data

(62) Division of application No. 13/527,258, filed on Jun. 19, 2012, now abandoned.

(51) Int. Cl.
*H05K 3/28* (2006.01)
*B05D 1/00* (2006.01)

(52) U.S. Cl.
CPC .............. *H05K 3/284* (2013.01); *B05D 1/62* (2013.01); *H05K 2201/09872* (2013.01); *H05K 2203/095* (2013.01); *Y10T 428/31504* (2015.04); *Y10T 428/31544* (2015.04)

(58) Field of Classification Search
CPC .................................. B05D 1/62; H05K 3/284
See application file for complete search history.

(56) References Cited

U.S. PATENT DOCUMENTS

2005/0089803 A1* 4/2005 Bouaidat .................. G03F 7/00
430/312

* cited by examiner

*Primary Examiner* — Joseph A Miller, Jr.
(74) *Attorney, Agent, or Firm* — Intellectual Strategies

(57) ABSTRACT

An electrical assembly which comprises a substrate and a conformal coating deposited on at least one surface of the substrate by plasma polymerization of a compound of formula (I) and deposition of a resulting polymer of the compound of formula (I), and plasma polymerization of a fluorohydrocarbon and deposition of a resulting polymer of the fluorohydrocarbon, such that the resulting polymer of the compound of formula (I) and the resulting polymer of the fluorohydrocarbon create discrete layers of the conformal coating; wherein the compound of formula (I) is an organic compound.

10 Claims, 6 Drawing Sheets

COATED ELECTRICAL ASSEMBLY

TECHNICAL FIELD

The present invention relates to a coated electrical assembly and to methods of preparing a coated electrical assembly.

BACKGROUND

Conformal coatings have been used for many years in the electronics industry to protect electrical assemblies from environmental exposure during operation. A conformal coating is a thin, flexible layer of protective lacquer that conforms to the contours of an electrical assembly, such as a printed circuit board, and its components.

There are 5 main classes of conformal coatings, according to the IPC definitions: AR (acrylic), ER (epoxy), SR (silicones), UR (urethanes) and XY (paraxylylene). Of these 5 types, paraxylylene (or parylene) is generally accepted to offer the best chemical, electrical and physical protection. However, the deposition process is time consuming and expensive, and the starting material is expensive.

Parylene is polymer with the following structure:

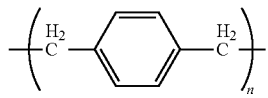

Parylene is deposited using a three stage vapor deposition process. A solid precursor is heated under vacuum and sublimes. It is important to appreciate that parylene, although sometimes erroneously called "paraxylene," is not in fact prepared from the compound paraxylene. In fact, the precursor is [2.2]paracyclophane:

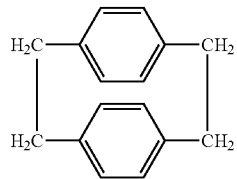 [SMILES: c1cc2ccc1CCc1ccc(cc1)CC2]

The chemical vapor is then passed through a high temperature furnace at around 680° C., so that the precursor splits into a reactive monomer. This reactive monomer then feeds into a deposition chamber and polymerizes on the surface of the substrate. Typical coating thicknesses for parylene are between 5 and 25 microns.

The parylene deposition technique described above is not ideal because of the high cost of the starting material, the high thermal energy consumption during monomer generation, the high vacuum requirements and the low growth rate.

There is therefore a need for conformal coatings that offer similar levels of chemical, electrical and physical protection as parylene, but that can be manufactured more easily and cheaply.

SUMMARY

The teachings of the present disclosure relate to an electrical assembly with a conformal coating and a method for conformally coating an electrical assembly. In accordance with one embodiment, an electrical assembly has a substrate and a conformal coating deposited on at least one surface of the substrate by plasma polymerization of a first compound of formula (I) and deposition of a resulting polymer of the first compound of formula (I) onto the at least one surface of the substrate, and plasma polymerization of a first fluorohydrocarbon and deposition of a resulting polymer of the first fluorohydrocarbon onto the resulting polymer of the first compound of formula (I), wherein the compound of formula (I) has the following structure:

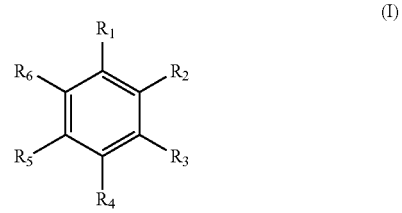

and wherein:
$R_1$ represents $C_1$-$C_3$ alkyl or $C_2$-$C_3$ alkenyl;
$R_2$ represents hydrogen, $C_1$-$C_3$ alkyl or $C_2$-$C_3$ alkenyl;
$R_3$ represents hydrogen, $C_1$-$C_3$ alkyl or $C_2$-$C_3$ alkenyl;
$R_4$ represents hydrogen, $C_1$-$C_3$ alkyl or $C_2$-$C_3$ alkenyl;
$R_5$ represents hydrogen, $C_1$-$C_3$ alkyl or $C_2$-$C_3$ alkenyl; and
$R_6$ represents hydrogen, $C_1$-$C_3$ alkyl or $C_2$-$C_3$ alkenyl.

Technical advantages of particular embodiments may include improved performance of the conformal coating, which may result in improved protection of the electrical assembly during operation.

DETAILED DESCRIPTION OF EXAMPLE EMBODIMENTS

Figure 1:
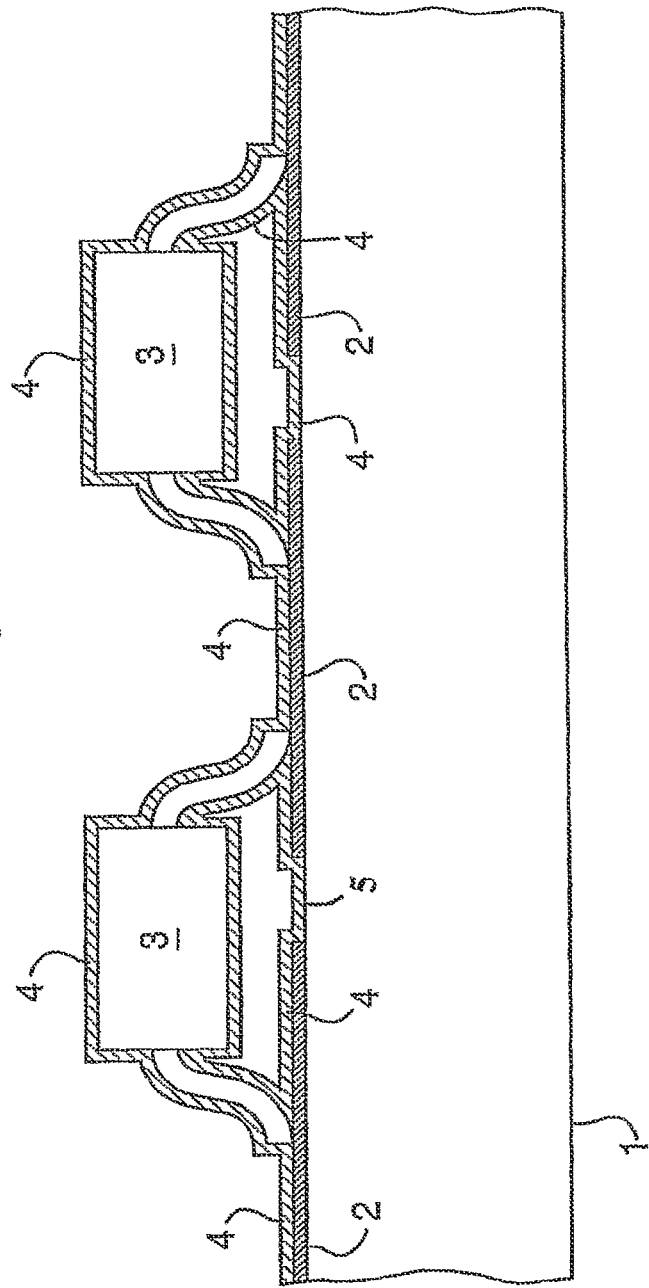
FIG. 1 shows an example of an electrical assembly with a conformal coating.

The conformal coating of the present disclosure may be obtained by plasma polymerization of specific precursor compounds and deposition of the resulting polymers. The polymerization reactions occur in situ. Polymerization, therefore, typically occurs on the surface at which deposition occurs. Polymerization and deposition are thus typically simultaneous.

Plasma-polymerized polymers are a unique class of polymers which cannot be prepared by traditional polymerization methods. Plasma-polymerized polymers have a highly disordered structure and are generally highly crosslinked, contain random branching and retain some reactive sites. Plasma-polymerized polymers are thus chemically distinct from polymers prepared by traditional polymerization methods known to those skilled in the art. These chemical and physical distinctions are well known and are described, for example in *Plasma Polymer Films, Hynek Biederman, Imperial College Press* 2004.

Plasma polymerization may be carried out in a reactor that generates a gas plasma which comprises ionized gaseous ions, electrons, atoms and/or neutral species. A reactor typically includes a chamber, a vacuum system, and one or more energy sources, although any suitable type of reactor configured to generate a gas plasma may be used. The energy source may include any suitable device configured to convert one or more gases to a gas plasma. In a particular embodiment, the energy source includes a heater, radio frequency (RF) generator, and/or microwave generator.

The electrical assembly may be placed in the chamber of a reactor and a vacuum system may be used to pump the chamber down to pressures in the range of $10^{-3}$ to 10 mbar. One or more gases can then be pumped into the chamber and an energy source can generate a stable gas plasma. One or more precursor compounds may then be introduced, as gases and/or liquids, into the gas plasma in the chamber. When introduced into the gas plasma, the precursor compounds may be ionized and/or decomposed to generate a range of active species in the plasma that polymerize to generate the polymer.

The exact nature and composition of the polymer deposited may depend on one or more of the following conditions (i) the plasma gas selected; (ii) the particular precursor compound(s) used; (iii) the amount of precursor compound(s) (which may be determined by the combination of the pressure of precursor compound(s) and the flow rate); (iv) the ratio of precursor compound(s); (v) the sequence of precursor compound(s); (vi) the plasma pressure; (vii) the plasma drive frequency; (viii) the pulse width timing; (ix) the coating time; (x) the plasma power (including the peak and/or average plasma power); (xi) the chamber electrode arrangement; and/or (xii) the preparation of the incoming assembly.

In certain embodiments, the plasma drive frequency is 1 kHz to 1 GHz and the plasma power is 100 to 250 W. In particular embodiments, the plasma power is in the range of 150 to 200 W, for example about 175 W. In certain embodiments, the mass flow rate is 5 to 100 sccm. In particular embodiments, the mass flow rate is 5 to 20 sccm, for example about 10 sccm. In various embodiments, the operating pressure is 10 to 100 mTorr, for example about 50 mTorr. Additionally, in certain embodiments, the coating time is 10 seconds to 20 minutes.

However, as a skilled person will appreciate, these conditions may be dependent on the size and geometry of the plasma chamber. Thus, depending on the specific plasma chamber that is being used, it may be beneficial for the skilled person to modify the operating conditions.

In various embodiments, the conformal coating may be formed by depositing a first polymer by plasma polymerization of a compound of formula (I), and then a second polymer by plasma polymerization of a fluorohydrocarbon. The resulting conformal coating will thus have two layers, which may be discrete layers. The first layer is in contact with surface of the electrical assembly and includes the polymer formed by plasma polymerization of the compound of formula (I). The second layer is in contact with the first layer and includes the polymer formed by plasma polymerization of the fluorohydrocarbon.

In various embodiments, the conformal coating may be formed by depositing a first polymer by plasma polymerization of a fluorohydrocarbon, and then a second polymer by plasma polymerization of a compound of formula (I). The resulting conformal coating will thus have two layers, which may be discrete layers. The first layer is in contact with surface of the electrical assembly and includes the polymer formed by plasma polymerization of the fluorohydrocarbon. The second layer is in contact with the first layer and includes the polymer formed by plasma polymerization of the compound of formula (I).

The deposition process may be repeated as often as desired, to build up a conformal coating having multiple layers, which may be discrete layers. Where two or more layers including a polymer formed by plasma polymerization of a compound of formula (I) are present, each compound of formula (I) used may be the same or different. Where two or more layers including a polymer formed by plasma polymerization of a fluorohydrocarbon are present, each fluorohydrocarbon used may be the same or different.

In certain embodiments, the polymer which is deposited last, that is to say the polymer that forms the upper or environmentally exposed surface of the conformal coating, may be obtained by plasma polymerization of a fluorohydrocarbon. In particular embodiments, the polymer which is deposited last, that is to say the polymer that forms the upper or environmentally exposed surface of the conformal coating, may be obtained by plasma polymerization of a compound of formula (I).

In various embodiments, the conformal coating may have at least four layers. This conformal coating may be obtained by (a) plasma polymerization of a first compound of formula (I) and deposition of the resulting polymer onto at least one surface of the electrical assembly, then (b) plasma polymerization of a first fluorohydrocarbon and deposition of the resulting polymer onto the polymer formed in step (a), then (c) plasma polymerization of a second compound of formula (I) and deposition of the resulting polymer onto the polymer formed in step (b), and then (d) plasma polymerization of a second fluorohydrocarbon and deposition of the resulting polymer onto the polymer formed in step (c). The compound of formula (I) and the fluorohydrocarbon may each respectively include one or more of the chemical compounds described herein. In various embodiments, the compound of formula (I) may include 1,4-dimethylbenzene and the fluorohydrocarbon may include hexafluoropropylene ($C_3F_6$).

In particular embodiments, the conformal coating may have at least six layers. This conformal coating may be obtained by (a) plasma polymerization of a first compound of formula (I) and deposition of the resulting polymer onto at least one surface of the electrical assembly, then (b) plasma polymerization of a first fluorohydrocarbon and deposition of the resulting polymer onto the polymer formed in step (a), then (c) plasma polymerization of a second compound of formula (I) and deposition of the resulting polymer onto the polymer formed in step (b), then (d) plasma polymerization of a second fluorohydrocarbon and deposition of the resulting polymer onto the polymer formed in step (c), then (e) plasma polymerization of a third compound of formula (I) and deposition of the resulting polymer onto the polymer formed in step (d), and then (f) plasma polymerization of a third fluorohydrocarbon and deposition of the resulting polymer onto the polymer formed in step (e). The compound of formula (I) and the fluorohydrocarbon may each respectively have one or more of the chemical compounds described herein. In various embodiments, the compound of formula (I) may include 1,4-dimethylbenzene and the fluorohydrocarbon may include hexafluoropropylene ($C_3F_6$).

In certain embodiments, the conformal coating may have at least eight layers. This conformal coating may be obtained by (a) plasma polymerization of a first compound of formula (I) and deposition of the resulting polymer onto at least one surface of the electrical assembly, then (b) plasma polymerization of a first fluorohydrocarbon and deposition of the resulting polymer onto the polymer formed in step (a), then (c) plasma polymerization of a second compound of formula (I) and deposition of the resulting polymer onto the polymer formed in step (b), then (d) plasma polymerization of a second fluorohydrocarbon and deposition of the resulting polymer onto the polymer formed in step (c), then (e) plasma polymerization of a third compound of formula (I) and deposition of the resulting polymer onto the polymer formed in step (d), then (f) plasma polymerization of a third fluorohydrocarbon and deposition of the resulting polymer onto the polymer formed in step (e), then (g) plasma polymerization of a fourth compound of formula (I) and deposition of the resulting polymer onto the polymer formed in step (f), and then (h) plasma polymerization of a fourth fluorohydrocarbon and deposition of the resulting polymer onto the polymer formed in step (g). The compound of formula (I) and fluorohydrocarbon may each respectively include one or more of the chemical compounds described herein. In various embodiments, the compound of formula (I) may include 1,4-dimethylbenzene and the fluorohydrocarbon may include hexafluoropropylene ($C_3F_6$).

In various embodiments, the conformal coating may have at least three layers. This conformal coating may be obtained by (i) plasma polymerization of a first fluorohydrocarbon of formula (I) and deposition of the resulting polymer onto at least one surface of the electrical assembly, then (ii) plasma polymerization of a compound of formula (I) and deposition of the resulting polymer onto the polymer formed in step (i), and then (iii) plasma polymerization of a second fluorohydrocarbon and deposition of the resulting polymer onto the polymer formed in step (ii). The compound of formula (I) and the fluorohydrocarbon may each respectively include one or more of the chemical compounds described herein. In certain embodiments, the compound of formula (I) may include 1,4-dimethylbenzene and the fluorohydrocarbon may include hexafluoropropylene ($C_3F_6$).

In particular embodiments, the conformal coating may have at least five layers. This conformal coating may be obtained by (i) plasma polymerization of a first fluorohydrocarbon of formula (I) and deposition of the resulting polymer onto at least one surface of the electrical assembly, then (ii) plasma polymerization of a first compound of formula (I) and deposition of the resulting polymer onto the polymer formed in step (i), and then (iii) plasma polymerization of a second fluorohydrocarbon and deposition of the resulting polymer onto the polymer formed in step (ii), then (iv) plasma polymerization of a second compound of formula (I) and deposition of the resulting polymer onto the polymer formed in step (iii), and then (v) plasma polymerization of a third fluorohydrocarbon and deposition of the resulting polymer onto the polymer formed in step (iv). The compound of formula (I) and the fluorohydrocarbon may each respectively include one or more of the chemical compounds described herein. In various embodiments, the compound of formula (I) may include 1,4-dimethylbenzene and the fluorohydrocarbon may include hexafluoropropylene ($C_3F_6$).

The thickness of the conformal coating in certain embodiments may depend upon the number of layers of each polymer that are deposited. In various embodiments, a layer obtainable by plasma polymerization of a compound of formula (I) may have a mean-average thickness of 250 to 350 nm. In particular embodiments, the mean-average thickness is in the range of 275 to 325 nm, for example about 300 nm. And in various embodiments, a layer obtainable by plasma polymerization of a fluorohydrocarbon may have a mean-average thickness of 25 to 100 nm. In particular embodiments, the mean-average thickness is in the range of 50 to 75 nm.

Thus, in certain embodiments, a conformal coating including one layer obtainable by plasma polymerization of a compound of formula (I) and one layer obtainable by plasma polymerization of a fluorohydrocarbon, may have a mean-average thickness of 275 to 450 nm. In various embodiments, the mean-average thickness may be 325 to 400 nm.

Similarly, in particular embodiments of a conformal coating including two layers obtainable by plasma polymerization of a compound of formula (I) and two layers obtainable by plasma polymerization of a fluorohydrocarbon, the mean-average thickness of the conformal coating may be 550 to 900 nm. In various embodiments, the mean-average thickness may be 650 to 800 nm.

In various embodiments, the thickness of the conformal coating may be substantially uniform or may vary from point to point.

Precursor compounds of formula (I) have the following structure:

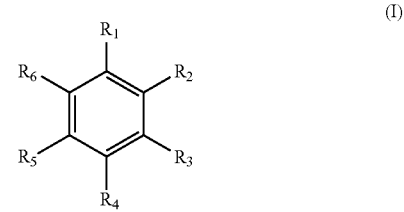

wherein $R_1$ represents $C_1$-$C_3$ alkyl or $C_2$-$C_3$ alkenyl; $R_2$ represents hydrogen, $C_1$-$C_3$ alkyl or $C_2$-$C_3$ alkenyl; $R_3$ represents hydrogen, $C_1$-$C_3$ alkyl or $C_2$-$C_3$ alkenyl; $R_4$ represents hydrogen, $C_1$-$C_3$ alkyl or $C_2$-$C_3$ alkenyl; $R_5$ represents hydrogen, $C_1$-$C_3$ alkyl or $C_2$-$C_3$ alkenyl; and $R_6$ represents hydrogen, $C_1$-$C_3$ alkyl or $C_2$-$C_3$ alkenyl.

As used herein, the term $C_1$-$C_3$ alkyl embraces a linear or branched hydrocarbon radical having 1 to 3 carbon atoms. In various embodiments, a $C_1$-$C_3$ alkyl may have 1 to 2 carbon atoms. Examples include methyl, ethyl, n-propyl and i-propyl.

As used herein, the term $C_2$-$C_3$ alkenyl embraces a linear or branched hydrocarbon radical having 2 or 3 carbon atoms and a carbon-carbon double bond. In certain embodiments, a $C_2$-$C_3$ alkenyl may be vinyl.

In various embodiments, $R_1$ may represent methyl or vinyl. $R_2$ may represent hydrogen, methyl or vinyl. $R_3$ may represent hydrogen, methyl or vinyl. $R_4$ may represent hydrogen, methyl or vinyl. $R_5$ may represent hydrogen, methyl or vinyl. $R_6$ may represent hydrogen, methyl or vinyl.

In particular embodiments, $R_5$ and $R_6$ may represent hydrogen.

In certain embodiments, $R_1$ may represent methyl or vinyl, $R_2$ may represent hydrogen, methyl or vinyl, $R_3$ may represent hydrogen, methyl or vinyl, $R_4$ may represent hydrogen, methyl or vinyl, $R_5$ may represent hydrogen and $R_6$ may represent hydrogen.

In particular embodiments, two of $R_2$ to $R_4$ may represent hydrogen.

Compounds of formula (I) may include 1,4-dimethylbenzene, 1,3-dimethylbenzene, 1,2-dimethylbenzene, toluene, 4-methyl styrene, 3-methyl styrene, 2-methyl styrene, 1,4-divinyl benzene, 1,3-divinyl benzene or 1,2-divinyl benzene. In certain embodiments, the compound of formula (I) is 1,4-dimethylbenzene.

A fluorohydrocarbon is a hydrocarbon material including fluorine atoms. Fluorohydrocarbons may be perfluoroalkanes, perfluoroalkenes, perfluoroalkynes, fluoroalkanes, fluoroalkenes and fluoroalkynes. In various embodiments, these compounds may contain up to 10 carbon atoms, and in certain embodiments up to five carbon atoms. Examples include $CF_4$, $C_2F_4$, $C_2F_6$, $C_3F_6$, $C_3F_8$ and $C_4F_8$. In various embodiments, the fluorohydrocarbon is hexafluoropropylene ($C_3F_6$).

In particular embodiments, the compound of formula (I) may include 1,4-dimethylbenzene, 1,3-dimethylbenzene, 1,2-dimethylbenzene, toluene, 4-methyl styrene, 3-methyl styrene, 2-methyl styrene, 1,4-divinyl benzene, 1,3-divinyl benzene or 1,2-divinyl benzene, and fluorohydrocarbon may include $CF_4$, $C_2F_4$, $C_2F_6$, $C_3F_6$, $C_3F_8$ or $C_4F_8$. In various embodiments, the compound of formula (I) is 1,4-dimethylbenzene and the fluorohydrocarbon is hexafluoropropylene ($C_3F_6$).

In certain embodiments, the electrical assembly may include a substrate, and the substrate may include an insulating material, a plurality of conductive tracks present on least one surface of the substrate, and at least one electrical component connected to at least one conductive track. In various embodiments, the conformal coating may cover the surface of the substrate on which the plurality of conductive tracks are present, the plurality of conductive tracks and the at least one electrical component.

In certain embodiments, an electrically conductive track may include any suitable electrically conductive material. In particular embodiments, an electrically conductive track may include gold, tungsten, copper, silver, aluminum, doped regions of semi-conductor substrates, conductive polymers and/or conductive inks.

Suitable shapes and configurations for the conductive tracks can be selected by a person skilled in the art for the particular assembly in question. In certain embodiments, an electrically conductive track is attached to the surface of the substrate along its entire length. In various embodiments, an electrically conductive track may be attached to the substrate at two or more points. For example, an electrically conductive track may be a wire attached to the substrate at two or more points, but not along its entire length.

An electrically conductive track may be formed on a substrate using any suitable method known to those skilled in the art. In various methods, electrically conductive tracks are formed on a substrate using a "subtractive" technique. In this method, a layer of metal (e.g., copper foil, aluminum foil, etc.) may be bonded to a surface of the substrate and then the unwanted portions of the metal layer are removed, leaving the desired conductive tracks. The unwanted portions of the metal layer may be removed from the substrate by chemical etching or photo-etching, milling. In certain methods, conductive tracks are formed on the substrate using an "additive" technique such as, for example, electroplating, deposition using a reverse mask, and/or any geometrically controlled deposition process. In particular embodiments, the substrate may include a silicon die or wafer, which may have doped regions as the conductive tracks.

The substrate may include any suitable insulating material that prevents the substrate from shorting the circuit of electrical assembly. In certain embodiments, the substrate may be an epoxy laminate material, a synthetic resin bonded paper, an epoxy resin bonded glass fabric (ERBGH), a composite epoxy material (CEM), PTFE (Teflon), or other polymer materials, phenolic cotton paper, silicon, glass, ceramic, paper, cardboard, natural and/or synthetic wood based materials, and/or other suitable textiles. In particular embodiments, the substrate may also include a flame retardant material, typically Flame Retardant 2 (FR-2) and/or Flame Retardant 4 (FR-4). The substrate may be a single layer of an insulating material or multiple layers of the same or different insulating materials. The substrate may be the board of a printed circuit board (PCB) made of any one of the materials listed above.

An electrical component may be any suitable circuit element of an electrical assembly. In various embodiments, an electrical component is a resistor, capacitor, transistor, diode, amplifier, antenna or oscillator. Any suitable number and/or combination of electrical components may be connected to the electrical assembly.

The electrical component may be connected to an electrically conductive track via a bond. The bond may be a solder joint, a weld joint, a wire-bond joint, a conductive adhesive joint, a crimp connection, or a press-fit joint. Suitable soldering, welding, wire-bonding, conductive adhesive and press-fit techniques are known to those skilled in the art, for forming the bond. In certain embodiments, the bond is a solder joint, a weld joint or a wire-bond joint.

Aspects of the invention will now be described with reference to the exemplary embodiments shown in FIGS. 1 to 3, in which like reference numerals refer to the same or similar components.

FIG. 1 shows an example of an electrical assembly of the invention. The electrical assembly includes a substrate 1 with an insulating material, conductive tracks 2 present on the surface of the substrate 1, and electrical components 3 connected to the conductive tracks 2. The conformal coating 4 covers the conductive tracks 2, the electrical components 3, and the surface 5 of the substrate 1 on which the conductive tracks and the electrical components are located.

Figure 2:
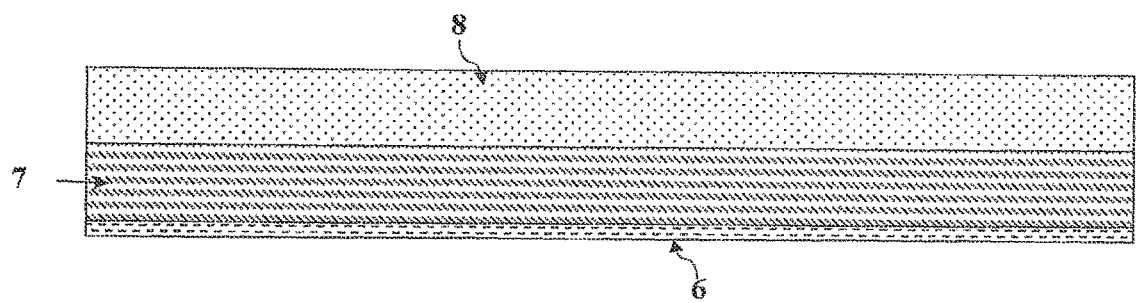
FIGS. 2 through 5 show cross sections of exemplary conformal coatings.

FIG. 2 shows a cross section through an exemplary conformal coating 4, similar to the one illustrated in FIG. 1. The conformal coating includes a first polymer 7 obtainable by plasma polymerization of a compound of formula (I) and deposition of the resulting polymer onto the surface 6 of the electrical assembly, and a second polymer 8 obtainable plasma polymerization of a fluorohydrocarbon and deposition of the resulting polymer onto the polymer 7.

Figure 3:
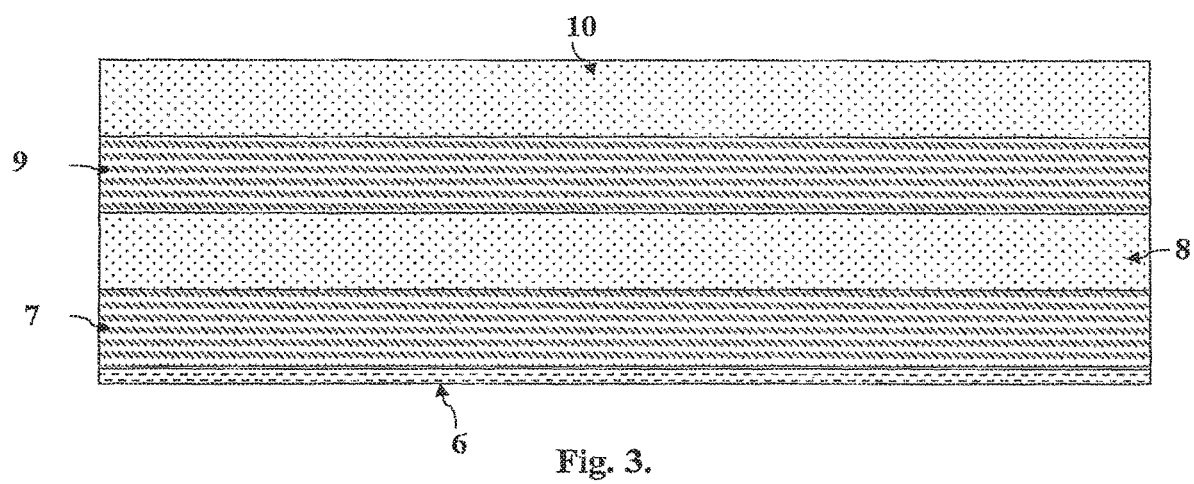

FIG. 3 shows a cross section through another exemplary conformal coating 4, similar to the one illustrated in FIG. 1. The conformal coating includes a first polymer 7 obtainable by plasma polymerization of a first compound of formula (I) and deposition of the resulting polymer onto the surface 6 of the electrical assembly, a second polymer 8 obtainable by plasma polymerization of a first fluorohydrocarbon and deposition of the resulting polymer onto the polymer 7, a third polymer 9 obtainable by plasma polymerization of a second compound of formula (I) and deposition of the resulting polymer onto the polymer 8, and a fourth polymer 10 obtainable by plasma polymerization of a second fluorohydrocarbon and deposition of the resulting polymer onto the polymer 9.

Figure 4:
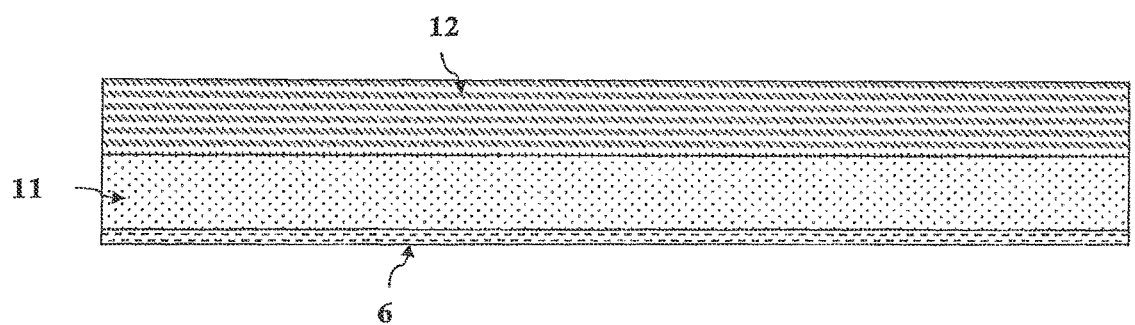

FIG. 4 shows a cross section through another exemplary conformal coating 4, similar to the one illustrated in FIG. 1. The conformal coating includes a first polymer 11 obtainable by plasma polymerization of a fluorohydrocarbon and deposition of the resulting polymer onto the surface 6 of the electrical assembly, and a second polymer 12 obtainable plasma polymerization of a compound of formula (I) and deposition of the resulting polymer onto the polymer 11.

Figure 5:
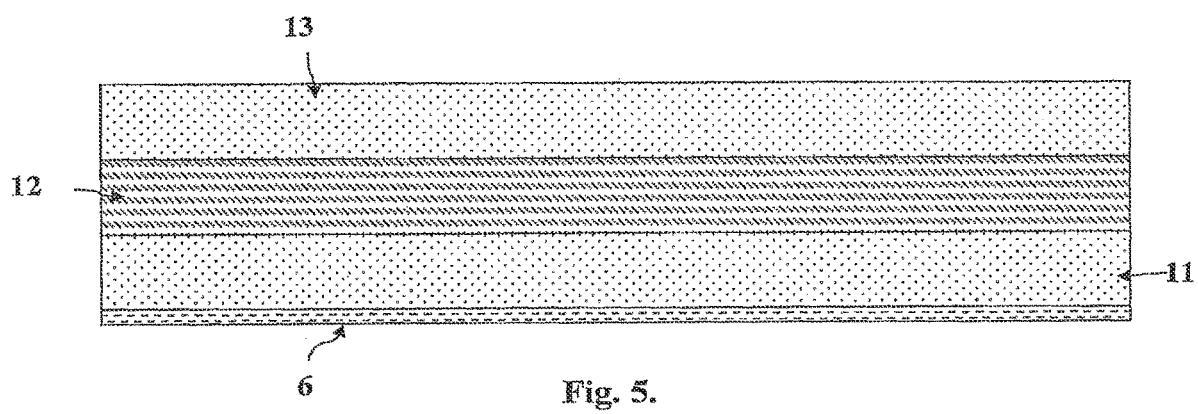

FIG. 5 shows a cross section through another exemplary conformal coating 4, similar to the one illustrated in FIG. 1. The conformal coating includes a first polymer 11 obtainable by plasma polymerization of a first fluorohydrocarbon and deposition of the resulting polymer onto the surface 6 of the electrical assembly, a second polymer 12 obtainable by plasma polymerization of a compound of formula (I) and deposition of the resulting polymer onto the polymer 11, and a third polymer 13 obtainable by plasma polymerization of a second fluorohydrocarbon and deposition of the resulting polymer onto the polymer 12.

Aspects of the present disclosure will now be described with reference to the Examples.

Example 1

An electrical assembly to be coated was placed into a plasma deposition chamber and the atmosphere was evacuated to 50 mTorr. 1,4-dimethylbenzene vapor was then introduced to the chamber at a flow rate of approximately 10 sccm using a mass flow controller. The RF generator was switched on at a power of 175 W and a plasma was formed. The 1,4-dimethylbenzene was ionized and then reacted with itself to form a continuous and conformal coating on the electrical assembly. Once the desired coating thickness had formed, the RF generator was switched off and the flow of 1,4-dimethylbenzene was stopped.

The chamber was brought to atmospheric pressure and opened and the electrical assembly with a conformal coating was removed.

Example 2

An electrical assembly to be coated was placed into a plasma deposition chamber and the atmosphere was evacuated to 50 mTorr. 1,4-dimethylbenzene vapor was then introduced to the chamber at a flow rate of approximately 10 sccm using a mass flow controller. The RF generator was switched on at a power of 175 W and a plasma was formed. The 1,4-dimethylbenzene was ionized and then reacted with itself to form a continuous and conformal coating on the electrical assembly. Once the desired coating thickness had formed, the RF generator was switched off and the flow of 1,4-dimethylbenzene was stopped.

The vacuum in the chamber was maintained and hexafluoropropylene gas was then introduced to the chamber at a specific flow rate which was controlled at approximately 5 sccm using a mass flow controller. The RF generator was switched on at a power of 175 W and a plasma was formed. The hexafluoropropylene was ionized and then reacted with itself to form a continuous and conformal coating on the previous coating. Once the desired coating thickness had formed, the RF generator was switched off and the flow of hexafluoropropylene was stopped.

The chamber was brought to atmospheric pressure and opened and the electrical assembly with a conformal coating was removed.

Example 3

An electrical assembly to be coated was placed into a plasma deposition chamber and the atmosphere was evacuated to 50 mTorr. 1,4-dimethylbenzene vapor was then introduced to the chamber at a flow rate of approximately 10 sccm using a mass flow controller. The RF generator was switched on at a power of 175 W and a plasma was formed. The 1,4-dimethylbenzene was ionized and then reacted with itself to form a continuous and conformal coating on the electrical. Once the desired coating thickness had formed, the RF generator was switched off and the flow of paraxylene was stopped.

The vacuum in the chamber was maintained and hexafluoropropylene gas was then introduced to the chamber at a flow rate of approximately 5 sccm using a mass flow controller. The RF generator was switched on at a power of 175 W and a plasma was formed. The hexafluoropropylene was ionized and then reacted with itself to form a continuous and conformal coating on the previous coating. Once the desired coating thickness had formed, the RF generator was switched off and the flow of hexafluoropropylene was stopped.

While maintaining the vacuum, two further layers were added, the first from 1,4-dimethylbenzene and the second from hexafluoropropylene, using the same methods as described above.

The chamber was brought to atmospheric pressure and opened and the electrical assembly with a conformal coating removed.

Example 4

An electrical assembly to be coated was placed into a plasma deposition chamber and the atmosphere was evacuated to 50 mTorr. Hexafluoropropylene gas was then introduced to the chamber at a flow rate of approximately 5 sccm using a mass flow controller. The RF generator was switched on at a power of 175 W and a plasma was formed. The hexafluoropropylene was ionized and then reacted with itself to form a continuous and conformal coating on the electrical assembly. Once the desired coating thickness had formed, the RF generator was switched off and the flow of hexafluoropropylene was stopped.

The vacuum in the chamber was maintained and 1,4-dimethylbenzene vapor was then introduced to the chamber at a flow rate of approximately 10 sccm using a mass flow controller. The RF generator was switched on at a power of 175 W and a plasma was formed. The paraxylene was ionized and then reacted with itself to form a continuous and conformal coating on the previous coating. Once the desired coating thickness had formed, the RF generator was switched off and the flow of 1,4-dimethylbenzene was stopped.

The vacuum in the chamber was maintained and hexafluoropropylene gas was then introduced to the chamber at a flow rate of 5 sccm using a mass flow controller. The RF generator was switched on at a power of 175 W and a plasma was formed. The hexafluoropropylene was ionized and then reacted with itself to form a continuous and conformal coating on the previous coating. Once the desired coating thickness had formed, the RF generator was switched off and the flow of hexafluoropropylene was stopped.

The chamber was brought to atmospheric pressure and opened and the electrical assembly with a conformal coating removed.

Example 5

Fourier transform infrared (FTIR) spectroscopy was carried out on the following conformal coatings:
 1. A conventional parylene conformal coating. The spectrum is shown in FIG. 6.

Figure 7:
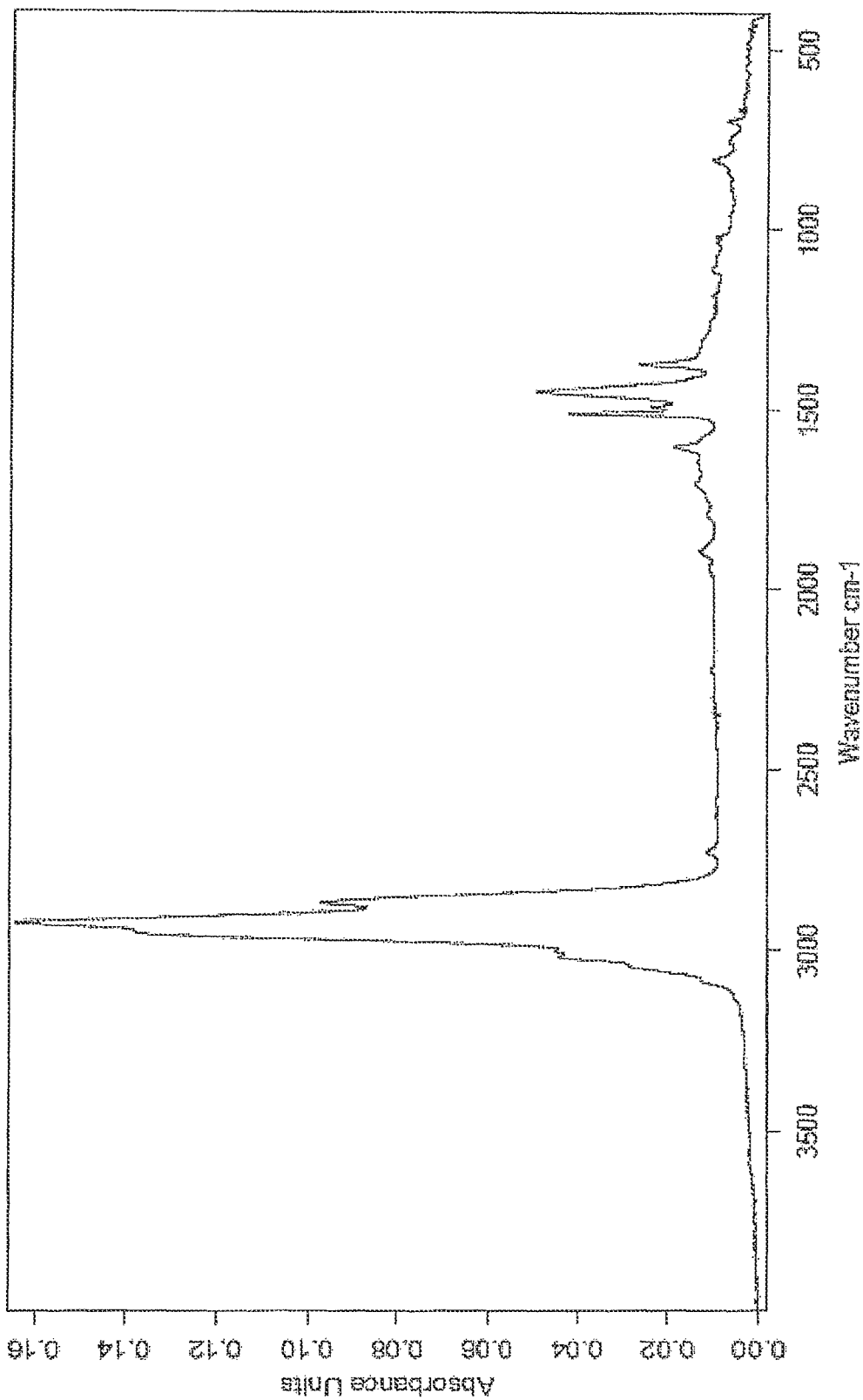
FIG. 7 shows the FTIR spectrum for a conformal coating prepared in Example 1, by plasma polymerization of 1,4-dimethylbenzene.

2. The conformal coating prepared in Example 1 above, by plasma polymerization of 1,4-dimethylbenzene. The spectrum is shown in FIG. 7.
3. The multilayer coatings prepared in Examples 2 to 4, which contain plasma polymerized 1,4-dimethylbenzene and plasma polymerized hexafluoropropylene. The spectrum is shown in FIG. 8.

Figure 6:
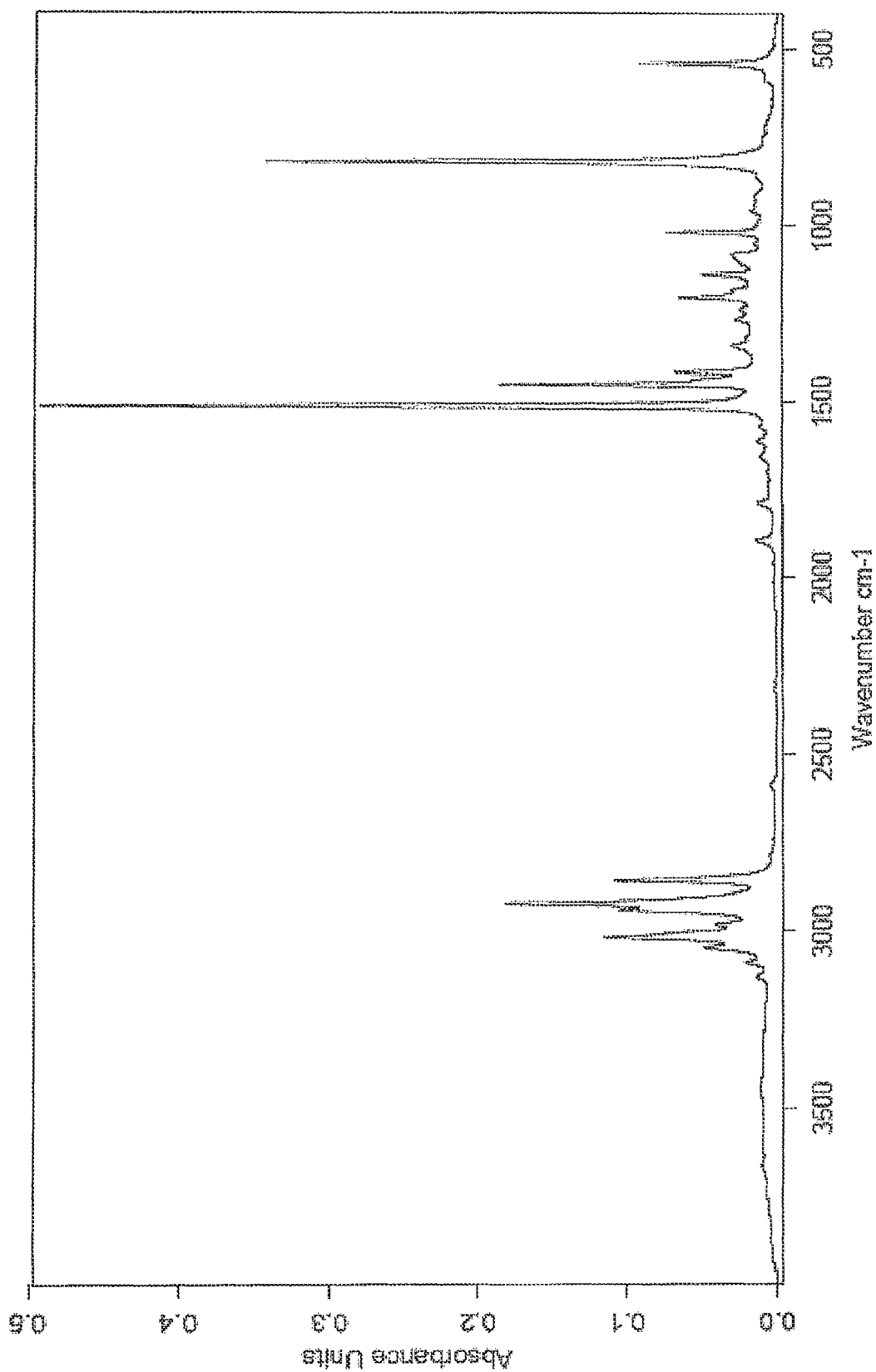
FIG. 6 shows the Fourier transform infrared (FTIR) spectrum for a parylene conformal coating.
Figure 8:
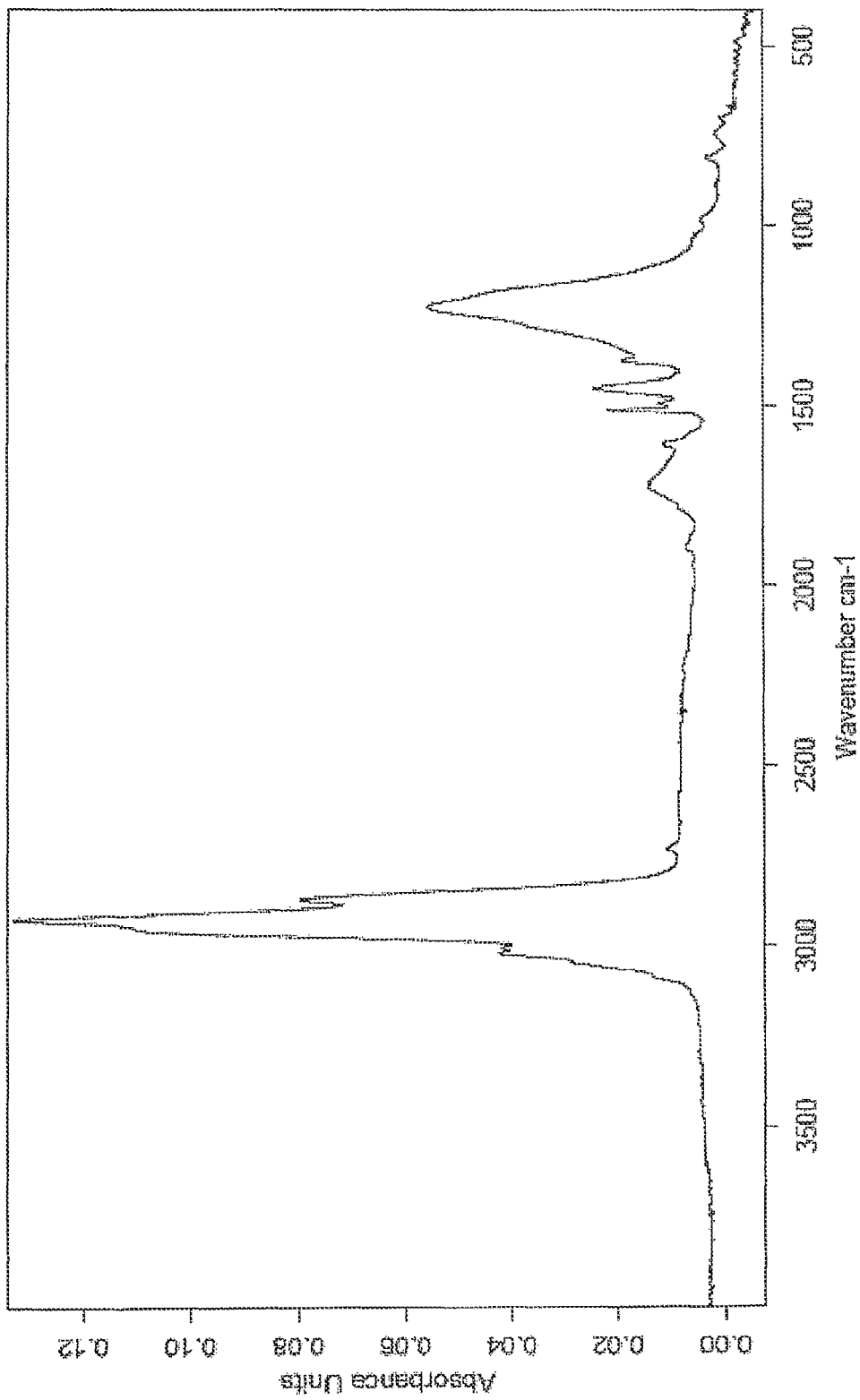
FIG. 8 shows the FTIR spectrum for the multilayer conformal coatings prepared in Examples 2 to 4, which contain plasma polymerized 1,4-dimethylbenzene and plasma polymerized hexafluoropropylene.

FIGS. 6 to 8 highlight how the coating obtainable by plasma polymerization of 1,4-dimethylbenzene is different from conventional parylene.

Parylene is a polymer with a regular, well defined structure which gives rise to sharp peaks in the spectrum of FIG. 6. Of particular interest is the cluster of peaks centered around 3000 cm$^{-1}$. The peaks to the right of 3000 cm$^{-1}$ represent the aliphatic C—H stretches, while those to the left are the aromatic C—H stretches due to the hydrogen atoms attached to the benzene ring.

FIG. 7 shows that plasma polymerized 1,4-dimethylbenzene is less well defined than parylene, as is characteristic of plasma polymers in general. This results in peaks which are broader, and less sharp. Additionally, the ratio of aromatic to aliphatic C—H stretches has changed considerably, because some of the ring structure in the 1,4-dimethylbenzene precursor has been lost.

As expected, FIG. 8 contains peaks similar to those in FIG. 7. An additional absorption at around 1200 cm$^{-1}$ is observed, which is due to the C—F stretch in the plasma polymerized hexafluoropropylene.

What is claimed is:

1. A method for conformally coating an electrical assembly, the method comprising:
    plasma polymerization of a first compound of formula (1) and deposition of a resulting polymer of the first compound of formula (I) onto at least one surface of an electrical assembly, the electrical assembly comprising a substrate, a substrate surface, at least one conductive track, at least one electrical component, and a bond connection between the at least one conductive track and the at least one electrical component, and
    plasma polymerization of a first fluorocarbon and deposition of the resulting polymer of the first fluorocarbon onto the resulting polymer of the first compound of formula (1);

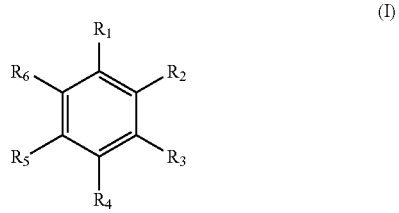

wherein:
R1 represents $C_1$-$C_3$ alkyl or $C_2$-$C_3$ alkenyl;
R2 represents hydrogen, $C_1$-$C_3$ alkyl or $C_2$-$C_3$ alkenyl;
R3 represents hydrogen, $C_1$-$C_3$ alkyl or $C_2$-$C_3$ alkenyl;
R4 represents hydrogen, $C_1$-$C_3$ alkyl or $C_2$-$C_3$ alkenyl;
R5 represents hydrogen, $C_1$-$C_3$ alkyl or $C_2$-$C_3$ alkenyl; and
R6 represents hydrogen, $C_1$-$C_3$ alkyl or $C_2$-$C_3$ alkenyl; and
wherein the resulting polymer comprising of the first compound of formula (I) has a thickness from 250 nanometers to 300 nanometers and the resulting polymer comprising of the first fluorocarbon has a thickness from 25 nanometers to 50 nanometers, wherein the polymer of the first compound of formula (I) comprises crosslinked structure and retains reactive sites, and wherein the resulting polymer is deposited onto the substrate surface, the at least one conductive track, the at least one electrical component, and the bond connection,
    wherein the resulting polymer is deposited onto a top side of the electrical component and further deposited on an underside of the electrical component opposite to the top side; and
    wherein the resulting polymer is deposited on the substrate below the electrical component.

2. The method of claim 1, further comprising:
    plasma polymerization of a second compound of formula (I) and deposition of a resulting polymer of the second compound of formula (1) onto the resulting polymer of the first fluorocarbon; and
    plasma polymerization of a second fluorocarbon and deposition of a resulting polymer of the second fluorocarbon onto the resulting polymer of the second compound of formula (I).

3. The method of claim 1, wherein the first compound of formula (I) is selected from the group consisting of 1,4-dimethylbenzene, 1,3-dimethylbenzene, 1,2-dimethylbenzene, toluene, 4-methyl styrene, 3-methyl styrene, 2-methyl styrene, 1,4-divinyl benzene, 1,3-divinyl benzene, and 1,2-divinyl benzene.

4. The method of claim 1, wherein the first fluorocarbon is selected from the group consisting of $CF_4$, $C_2F_4$, $C_2F_6$, $C_3F_6$, $C_3F_8$, and $C_4F_8$.

5. The method of claim 1, wherein the first compound of formula (I) comprises 1,4-dimethylbenzene and the first fluorocarbon comprises $C_3F_6$.

6. A method for conformally coating an electrical assembly, the method comprising:
    plasma polymerization of a first fluorocarbon and deposition of a resulting polymer of the first fluorocarbon onto at least one surface of the
    electrical assembly, the electrical assembly comprising a substrate, a substrate surface, at least one conductive track, at least one electrical component, and a bond connection between the at least one conductive track and the at least one electrical component, and
    plasma polymerization of a first compound of formula (1) and deposition of a resulting polymer of the first compound of formula (J) onto the resulting polymer of the first fluorocarbon;

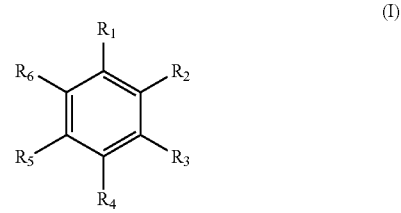

wherein:
R1 represents $C_1$-$C_3$ alkyl or $C_2$-$C_3$ alkenyl;
R2 represents hydrogen, $C_1$-$C_3$ alkyl or $C_2$-$C_3$ alkenyl;
R3 represents hydrogen, $C_1$-$C_3$ alkyl or $C_2$-$C_3$ alkenyl;
R4 represents hydrogen, $C_1$-$C_3$ alkyl or $C_2$-$C_3$ alkenyl;
R5 represents hydrogen, $C_1$-$C_3$ alkyl or $C_2$-$C_3$ alkenyl; and
R6 represents hydrogen, $C_1$-$C_3$ alkyl or $C_2$-$C_3$ alkenyl; and wherein the resulting polymer consisting essentially of the first compound of formula (1) has a thickness from 250 nanometers to 300 nanometers and the resulting polymer consisting essentially of the first fluorohydrocarbon has a thickness from 25 nanometers to 50 nanometers, wherein the polymer of the first compound of formula (I) comprises crosslinked structure and retains reactive sites and wherein the resulting polymer is deposited onto the substrate surface the at least one conductive track, the at least one electrical component, and the bond connection, and wherein the resulting polymer is deposited onto a top side of the electrical component and further deposited on an underside of the electrical component opposite to the top side; and wherein the resulting polymer is deposited on the substrate below the electrical component.

7. The method of claim 6, further comprising plasma polymerization of a second fluorocarbon and deposition of a resulting polymer of the second fluorocarbon onto the resulting polymer of the first compound of formula (I).

8. The method of claim 6, wherein the first compound of formula (I) is selected from the group consisting of 1,4-dimethylbenzene, 1,3-dimethylbenzene, 1,2-dimethylbenzene, toluene, 4-methyl styrene, 3-methyl styrene, 2-methyl styrene, 1,4-divinyl benzene, 1,3-divinyl benzene, and 1,2-divinyl benzene.

9. The method of claim 6, wherein the first fluorocarbon is selected from the group consisting of $CF_4$, $C_2F_4$, $C_2F_6$, $C_3F_6$, $C_3F_8$, and $C_4F_8$.

10. The method of claim 6, wherein the first compound of formula (I) comprises 1,4-dimethylbenzene and the first fluorocarbon comprises $C_3F_6$.

* * * * *